United States Patent
Baik et al.

(10) Patent No.: US 7,482,206 B2
(45) Date of Patent: Jan. 27, 2009

(54) SEMICONDUCTOR DEVICES HAVING NANO-LINE CHANNELS AND METHODS OF FABRICATING THE SAME

(75) Inventors: Seung-Jae Baik, Seoul (KR); In-Seok Yeo, Seoul (KR); Sang-Sig Kim, Seoul (KR); Ki-Hyun Kim, Seoul (KR); Dong-Young Jeong, Seoul (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 11/422,663

(22) Filed: Jun. 7, 2006

(65) Prior Publication Data

US 2007/0072335 A1    Mar. 29, 2007

(30) Foreign Application Priority Data

Jun. 8, 2005 (KR) .................. 10-2005-0048709
Mar. 8, 2006 (KR) .................. 10-2006-0021692

(51) Int. Cl.
  *H01L 21/335* (2006.01)
(52) U.S. Cl. .................. 438/142; 438/216; 438/259; 438/270; 257/330; 257/388; 257/E51.007; 257/401
(58) Field of Classification Search ............. 438/142, 438/216, 259, 270; 977/708, 707, 788, 809, 977/827; 257/330, 388, E51.007, 401
  See application file for complete search history.

(56) References Cited

U.S. PATENT DOCUMENTS

| 5,757,045 | A * | 5/1998 | Tsai et al. .................. 257/336 |
| 6,949,481 | B1 * | 9/2005 | Halliyal et al. .............. 438/795 |
| 2004/0036128 | A1 * | 2/2004 | Zhang et al. .................. 257/401 |
| 2004/0127005 | A1 * | 7/2004 | Lee et al. .................... 438/595 |
| 2004/0134515 | A1 * | 7/2004 | Castrucci ...................... 134/2 |
| 2005/0121706 | A1 | 6/2005 | Chen et al. |
| 2005/0221562 | A1 * | 10/2005 | Yoshida et al. .............. 438/261 |

(Continued)

FOREIGN PATENT DOCUMENTS

JP    2003-264249    9/2003

(Continued)

OTHER PUBLICATIONS

Office Action, Korean Patent Application No. 10-2006-0021692, Mar. 29, 2007.

(Continued)

*Primary Examiner*—N Drew Richards
*Assistant Examiner*—Ankush k Singal
(74) *Attorney, Agent, or Firm*—Myers Bigel Sibley & Sajovec, PA (57) ABSTRACT

A semiconductor device includes a substrate, a gate electrode on the substrate and source and drain electrodes disposed at respective sides of the gate electrode. The device further includes a nano-line passing through the gate electrode and extending into the source and drain electrodes and having semiconductor characteristics. The nano-line may include a nano-wire and/or a nano-tube. A gate insulating layer may be interposed between the nano-line and the gate electrode. The source and drain electrodes may be disposed adjacent respective opposite sidewalls of the gate electrode, and the gate insulating layer may be further interposed between the source and drain electrodes and the gate electrode. Fabrication methods for such devices are also described.

16 Claims, 7 Drawing Sheets

U.S. PATENT DOCUMENTS

2005/0266622 A1* 12/2005 Arghavani et al. .......... 438/197
2005/0266631 A1* 12/2005 Kim et al. ................... 438/216

FOREIGN PATENT DOCUMENTS

| JP | 2005-064452 | 3/2005 |
| JP | 2005-285822 | 10/2005 |
| KR | 2003-017508 | 1/2003 |
| KR | 1020040094179 A | 11/2004 |
| KR | 1020050006634 A | 1/2005 |

OTHER PUBLICATIONS

Notice of Allowability, Korean Patent Application No. 10-2006-21692, Jul. 6, 2007.

* cited by examiner

SEMICONDUCTOR DEVICES HAVING NANO-LINE CHANNELS AND METHODS OF FABRICATING THE SAME

CROSS-REFERENCE TO RELATED APPLICATION

This application claims priority under 35 U.S.C. § 119 from Korean Patent Application No. 2005-48709, filed on Jun. 8, 2005, and from Korean Patent Application No. 2006-21692, filed on Mar. 8, 2006, the disclosures of which are hereby incorporated by reference herein as if set forth in their entirety.

BACKGROUND OF THE INVENTION

The present invention relates to semiconductor devices and methods of fabricating the same and, more particularly, to nano-line semiconductor devices and methods of fabricating the same.

A semiconductor device, such as a metal-oxide semiconductor field-effect transistor (MOSFET), may be used as a switching device. Much research has been conducted to scale down the MOSFET in accordance with recent trends of a high integration density and a high performance of a semiconductor device. The scaling down of the MOSFET may improve the integration density of a semiconductor device, may improve a switching operating speed, and may improve a signal transfer speed by allowing shortening of distances between devices. However, conventional scaling-down of MOSFETs typically is based on a top-down approach that may be extended down to a nanometer level. A top-down approach, however, may present problems with respect to limits on length of a gate, a thickness of a gate insulating layer, an operating voltage, a junction depth of impurities, and the like.

Techniques for scaling down the size of the MOSFET have been described in US Patent Application Publication No. US2005/0121706 A1 entitled "Semiconductor Nano-Rod Devices" by Chen, et. al. According to Chen, et. al., a semiconductor nano-rod device having a cylindrical gate may be fabricated using a silicon on insulator (SOI) substrate. Specifically, a semiconductor layer formed on an insulating layer is patterned. The patterned semiconductor layer is formed to include a source region, a drain region and a channel region, and the planar areas of the source and drain regions may be greater than the planar area of the channel region. The insulating layer below the patterned semiconductor layer may be isotropically etched such that at least a lower portion of the channel region of the patterned semiconductor layer is exposed. As a result, the channel region of the patterned semiconductor layer may be entirely exposed. Then, a cylindrical gate structure may be formed to surround the channel region. However, as such a nano-rod device is realized using the conventional SOI substrate by a top-down approach, the scaling-down of the MOS transistor may be difficult.

An alternative technique for scaling down a MOSFET has been proposed. A carbon nano-tube can exhibit metal characteristics and/or semiconductor characteristics depending on a diameter and a shape of the carbon nano-tube. Research has been conducted toward developing a semiconductor device, such as a transistor, using a carbon nano-tube having semiconductor characteristics.

SUMMARY OF THE INVENTION

In some embodiments of the present invention, a semiconductor device includes a substrate, a gate electrode on the substrate and source and drain electrodes disposed at respective sides of the gate electrode. The device further includes a nano-line passing through the gate electrode, extending into the source and drain electrodes and having semiconductor characteristics. The nano-line may include a nano-wire and/or a nano-tube. For example, the nano-line may include a Si nano-wire, a Ge nano-wire, a GaN nano-wire, a GaP nano-wire, a SiC nano-wire, a ZnO nano-wire, a carbon nano-tube and/or an organic nano-tube. A gate insulating layer may be interposed between the nano-line and the gate electrode. The source and drain electrodes may be disposed adjacent respective opposite sidewalls of the gate electrode, and the gate insulating layer may be further interposed between the source and drain electrodes and the gate electrode.

Further embodiments of the present invention provide methods of fabricating a semiconductor device. A sacrificial material layer is formed on a substrate, and at least one nano-line having semiconductor characteristics is disposed on the sacrificial material layer, e.g., by deposition of a solvent bearing pre-formed nano-lines. A mask pattern is formed on a portion of the nano-line and the sacrificial material layer. Spaced apart source and drain electrodes are formed at respective sides of the mask pattern and surrounding respective portions of the nano-line at the respective sides of the mask pattern. The mask pattern and at least a portion of the sacrificial material layer below the mask pattern are removed to form an opening exposing a portion of the nano-line between the source and drain electrodes. A gate electrode surrounding the exposed portion of the nano-line is formed.

The sacrificial material layer may include an organic material layer and/or an insulating layer. The organic material layer may include hexamethyldisilazane (HMDS).

The nano-line may include a nano-wire and/or a nano-tube. For example, the nano-line may include a Si nano-wire, a Ge nano-wire, a GaN nano-wire, a GaP nano-wire, a SiC nano-wire, a ZnO nano-wire, a carbon nano-tube and/or an organic nano-tube.

Methods may further include removing portions of the sacrificial material layer disposed at respective sides of the mask pattern after forming the mask pattern such that portions of the nano-line are exposed at the respective sides of the mask pattern and spaced apart from the substrate. Forming the source and drain electrodes may include forming a conductive layer on the substrate from which the portions of the sacrificial material layer disposed at the respective sides of the mask pattern are removed and planarizing the conductive layer to expose the mask pattern. Forming the source and drain electrodes may include forming a conductive layer on the substrate from which the portions of the sacrificial material layer disposed at the respective sides of the mask pattern are removed such that sidewalls of an upper region of the mask pattern are exposed, and a portion of the conductive layer disposed on the mask pattern may be removed when the mask pattern is removed. The conductive layer may be formed using, for example, physical vapor deposition.

In some embodiments, the nano-line has a core-shell structure including a nano-wire surrounded by a surface insulating layer. Portions of the surface insulating layer of the nano-line at the respective sides of the mask pattern may be removed after forming the mask pattern.

In some embodiments, a gate insulating layer may be formed on the substrate before forming the gate electrode, wherein the gate insulating layer surrounds at least a portion of the nano-line disposed between the source and drain electrodes. The gate insulating layer may be formed using atomic layer deposition and/or chemical vapor deposition. Forming a gate electrode may include forming a conductive material layer on the substrate having the gate insulating layer thereon and planarizing the conductive material layer to expose portions of the gate insulating layer covering upper surfaces of the source and drain electrodes.

In some embodiments, forming a gate electrode includes forming a conductive material layer on the substrate having the opening exposing the portion of the nano-line between the source and drain electrodes and patterning the conductive material layer using photolithography and etch processes. In further embodiments, forming a gate electrode includes forming a gate mask pattern having a gate opening exposing a portion of the nano-line between the source and drain electrodes, forming a conductive material layer on the gate mask pattern and adjacent portions of the substrate, leaving portions of sidewalls of the gate mask pattern exposed, and removing the gate mask pattern and the conductive material layer on the gate mask pattern.

BRIEF DESCRIPTION OF THE DRAWINGS

The above and other features and advantages of the present invention will become more apparent to those of ordinary skill in the art by describing in detail preferred embodiments thereof with reference to the attached drawings in which.

DETAILED DESCRIPTION

The present invention will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions are exaggerated for clarity. Like numbers refer to like elements throughout. As used herein the term "and/or" includes any and all combinations of one or more of the associated listed items.

The terminology used herein is for the purpose of describing particular embodiments and is not intended to be limiting of the invention. As used herein, the singular forms "a", "an" and "the" are intended to include the plural forms as well, unless the context clearly indicates otherwise. It will be further understood that the terms "includes" and/or "including," when used in this specification, specify the presence of stated features, integers, steps, operations, elements, and/or components, but do not preclude the presence or addition of one or more other features, integers, steps, operations, elements, components, and/or groups thereof.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers refer to like elements throughout the specification.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the present invention are described herein with reference to perspective illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated or described as a rectangle will, typically, have rounded or curved features. Thus, the regions illustrated in the figures are schematic in nature and their shapes are not intended to illustrate the precise shape of a region of a device and are not intended to limit the scope of the present invention.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein. It will also be appreciated by those of skill in the art that references to a structure or feature that is disposed "adjacent" another feature may have portions that overlap or underlie the adjacent feature.

Figure 3A:
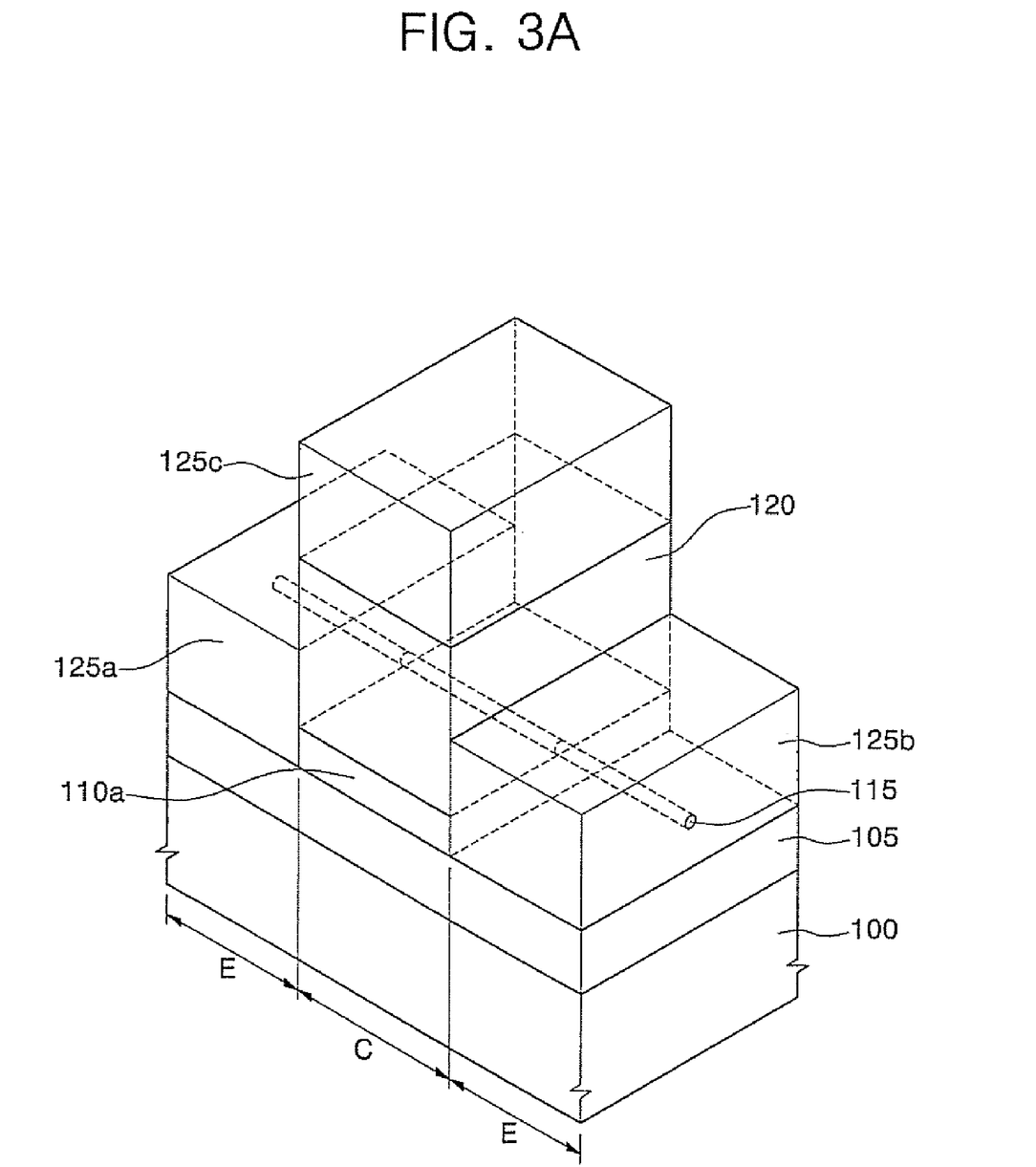
Figure 3B:
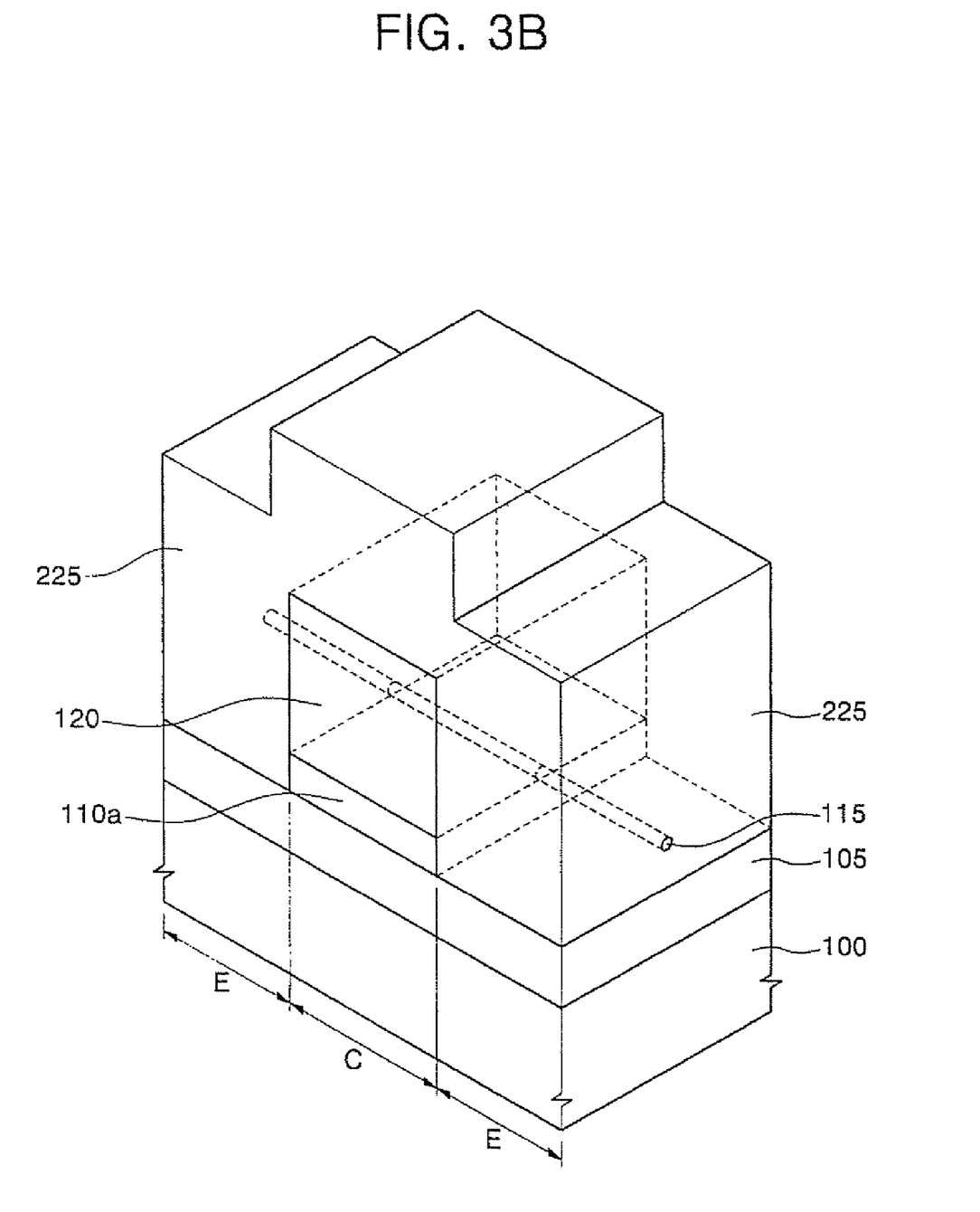
Figure 4:
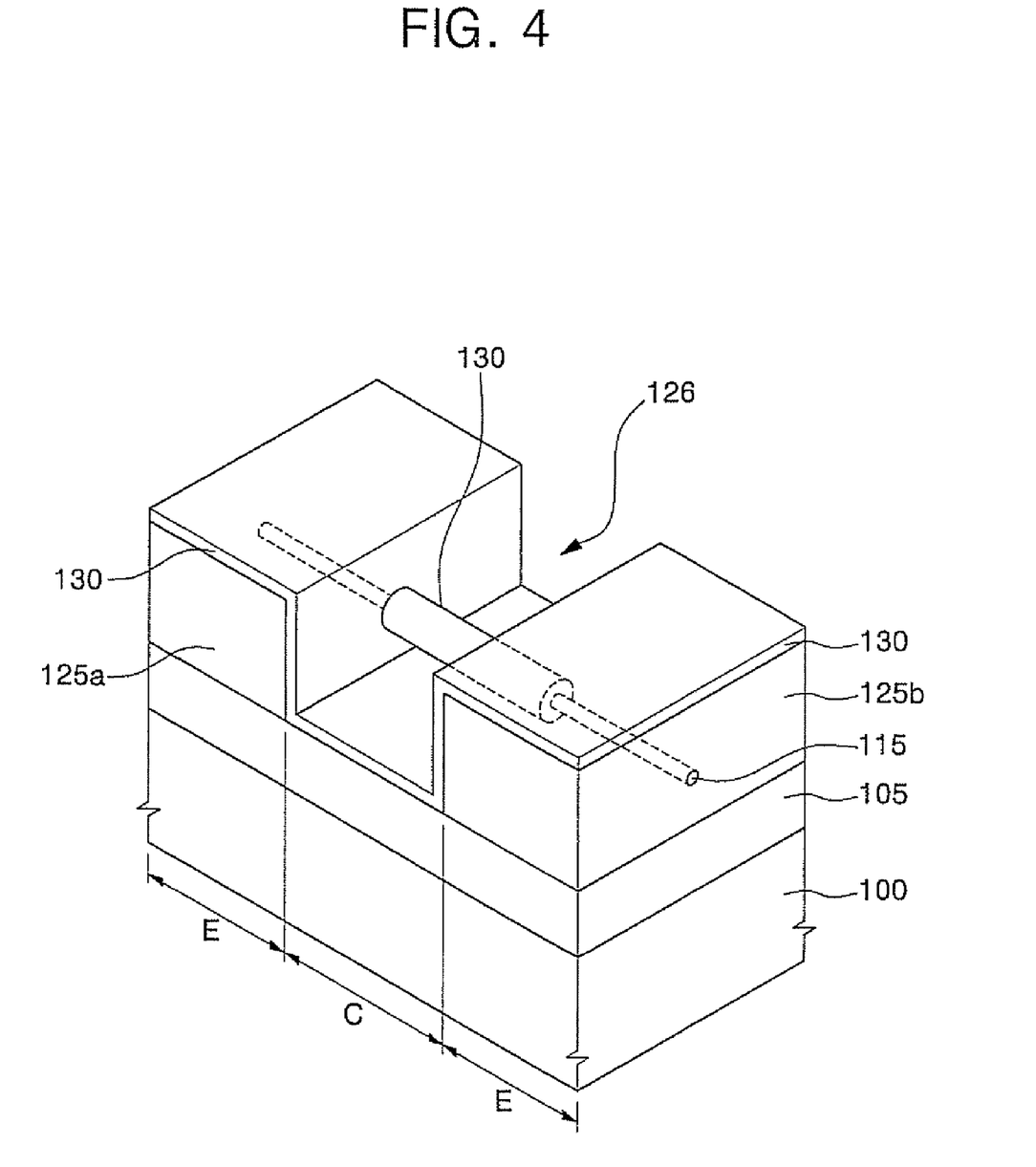
Figure 5:
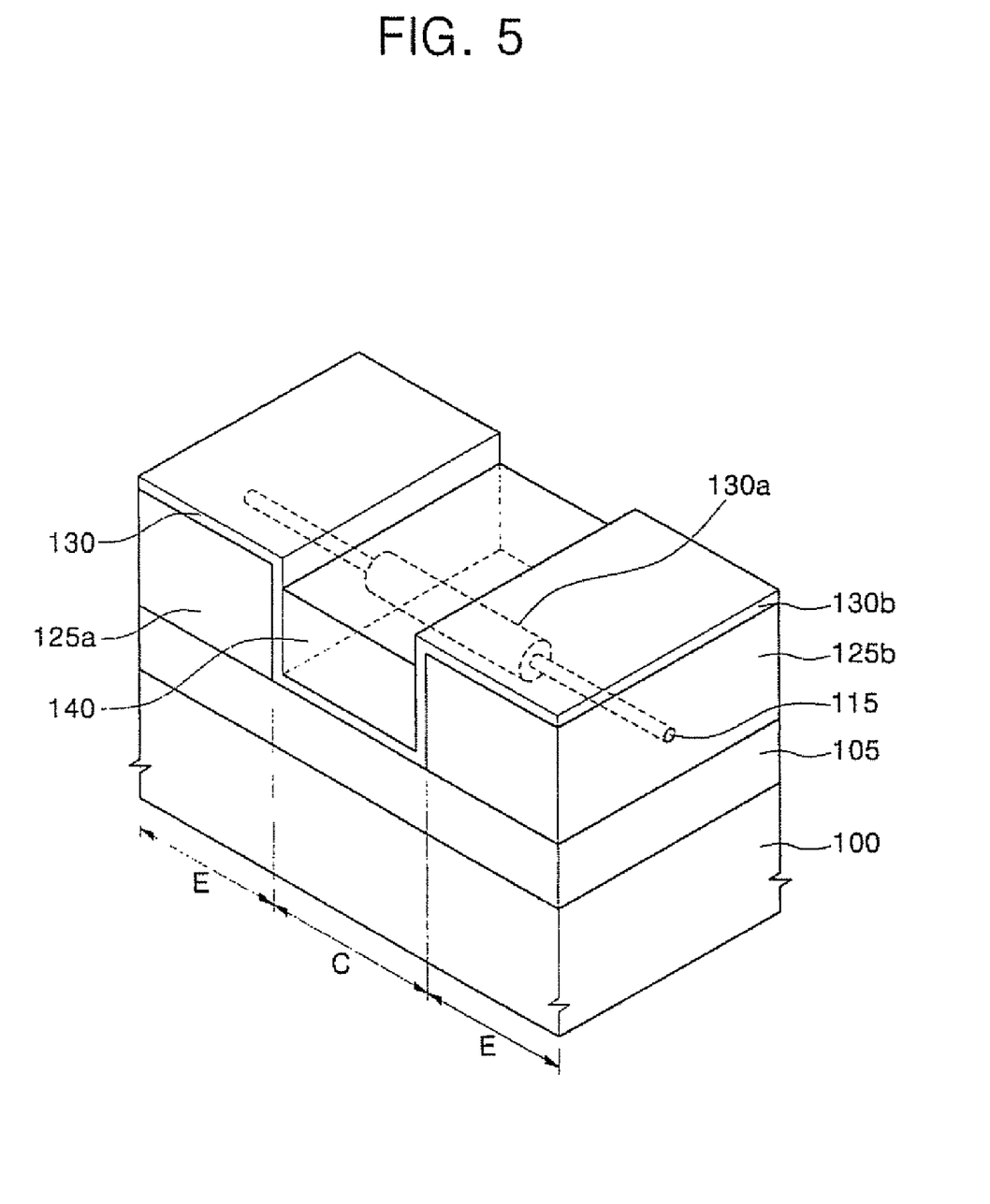

FIGS. 1 through 6 are perspective views illustrating nano-line semiconductor devices and methods of fabricating the same according to some embodiments of the present invention. Referring to FIG. 5, a lower layer 105 may be disposed on a substrate 100. The substrate 100 may be, for example, a semiconductor substrate or a semiconductor substrate having an insulating layer thereon. The lower layer 105 may be an insulating layer, such as a silicon oxide layer. A gate electrode 140 is disposed on the lower layer 105. The gate electrode 140 may include a conductive material layer. The conductive material may include a metal layer, a metal silicide layer and/or a silicon layer.

A source electrode 125a and a drain electrode 125b are disposed on respective sides of the gate electrode 140. In this case, the source electrode 125a and the drain electrode 125b may be disposed adjacent respective sidewalls of the gate electrode 140. The source electrode 125a and the drain electrode 125b may include, for example, a metal-containing material layer. For example, the metal material layer may be a metal layer, such as a Ti layer, a Ni layer, a Co layer, a W layer, and/or a Pt layer, and/or a metal silicide layer, such as a TiSi layer, a NiSi layer, a CoSi layer, a WSi layer, and a PtSi layer.

A nano-line 115 having semiconductor characteristics extends through the gate electrode 140 and into the source electrode 125a and the drain electrode 125b. The portion of the nano-line 115 surrounded by the gate electrode 140 may serve as a channel region. The portions of the nano-line 115 extending into the source electrode 125a and the drain electrode 125b may be surrounded by the source and drain electrodes 125a and 125b, respectively. The nano-line 115 may be a nano-wire, nano-tube or other line-like structure. The nano-line 115 may comprise a nano-wire including silicon (Si), germanium (Ge), gallium nitride (GaN), gallium phosphide (GaP), silicon carbide (SiC), and/or zinc oxide (ZnO), and/or a nano-tube 115 including carbon (C) or an organic compound.

A portion 130a of a gate insulating layer 130 may be interposed between the nano-line 115 and the gate electrode 140. The gate insulating layer portion 130a surrounding the nano-line 115 may extend between the opposite sidewalls of the gate electrode 140 and the sidewalls of the source and drain electrodes 125a and 125b adjacent thereto. The gate insulating layer portion 130a may include, for example, an aluminum oxide ($Al_2O_3$) layer, a titanium dioxide ($TiO_2$) layer, a hafnium oxide ($HfO_2$) layer, a zirconium oxide ($ZrO_2$) layer, a silicon nitride layer ($Si_3N_4$) layer, a tantalum oxide ($Ta_2O_5$) layer, and/or a silicon oxide ($SiO_2$) layer.

Figure 6:
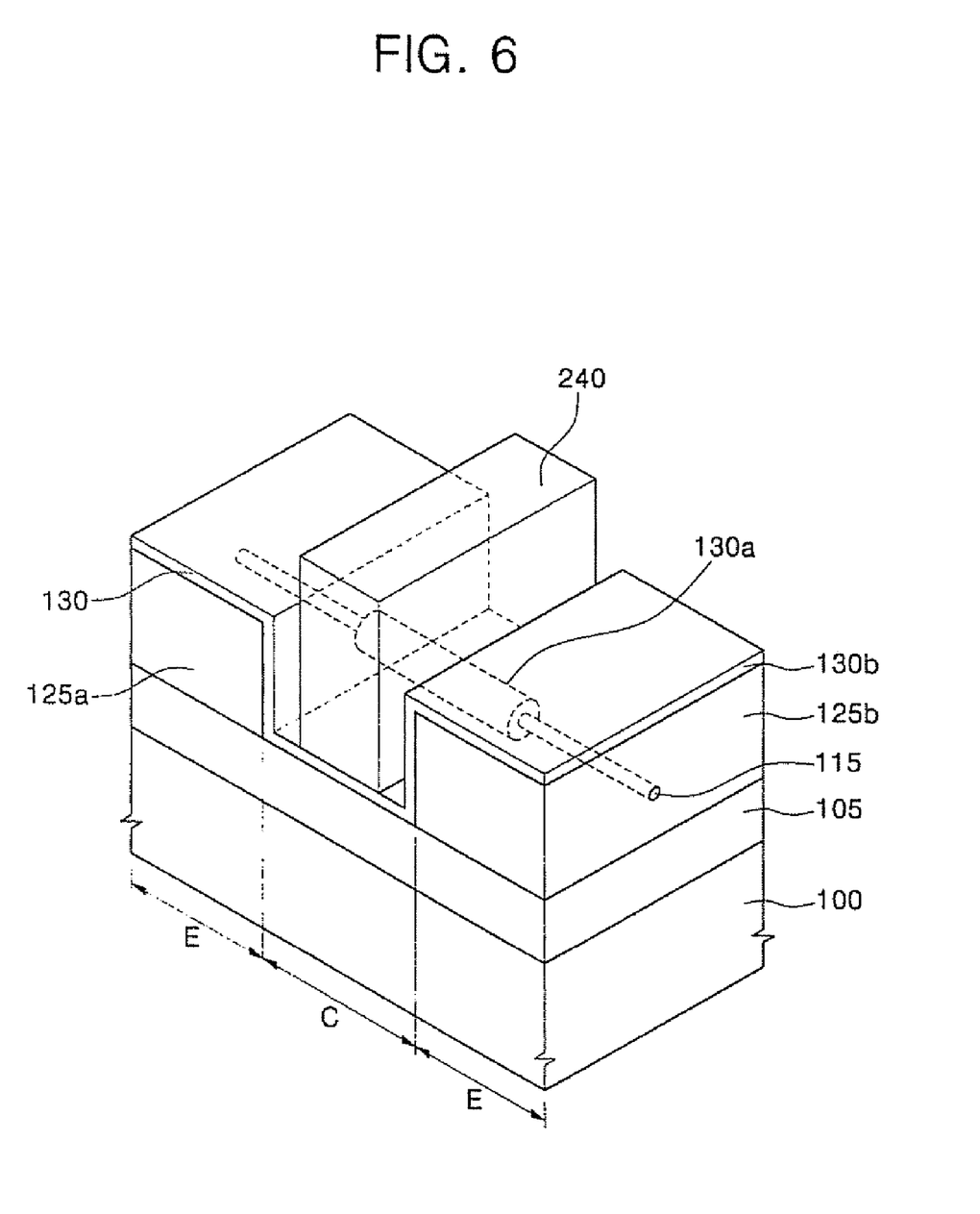

The source and drain electrodes 125a and 125b may be spaced apart from the opposing sidewalls of the gate electrode 140 a predetermined distance. Specifically, a gate insulating layer portion 130b may separate the source and drain electrodes 125a and 125b from the gate electrode 140, such that the source and drain electrodes 125a and 125b are spaced apart from the gate electrode 140 by a thickness of the gate insulating layer portion 130b. As a result, a transistor as illustrated in FIG. 5 may be provided. The transistor may have an improved current driving ability. In further embodiments, the source and drain electrodes 125a and 125b may be spaced apart from a gate electrode 240 a distance greater than a thickness of a gate insulating layer portion 130b, as shown in FIG. 6.

In the illustrated embodiments, a channel region of the nano-line 115 may be surrounded by the gate insulating layer portion 130a and a gate electrode 140, 240. Thus, a transistor having a cylindrical gate may be provided. The cylindrical gate can significantly suppress a surface scattering of the electrons moving through a channel in comparison to a gate of a conventional planar transistor. As a result, an operating speed of a semiconductor device can be improved.

In some embodiments, predetermined portions of the nano-line 115 may be surrounded by the source and drain electrodes 125a and 125b. As a result, areas of contact between respective ones of the source and drain electrodes 125a and 125b and the nano-line 115 can be increased such that source/drain contact resistance characteristics can be improved. Furthermore, a length of a portion of the nano-line 115 disposed between the portions of the nano-line 115 contacting the source and drain electrodes 125a and 125b and the portion of the nano-line 115 surrounded by the gate electrode 140 can be reduced such that current driving characteristics of the device can be improved. Schottky barriers may be formed at junctions of the source and drain electrodes 125a and 125b and the nano-line 115. As a result, a Schottky barrier tunnel transistor using the nano-line 115 may be provided.

Therefore, transistors having a cylindrical gate and a nano-line channel may be provided. These devices may have improved operating speed and other performance characteristics. Such transistors may also be scaled down to produce a highly-integrated semiconductor device.

Figure 1:
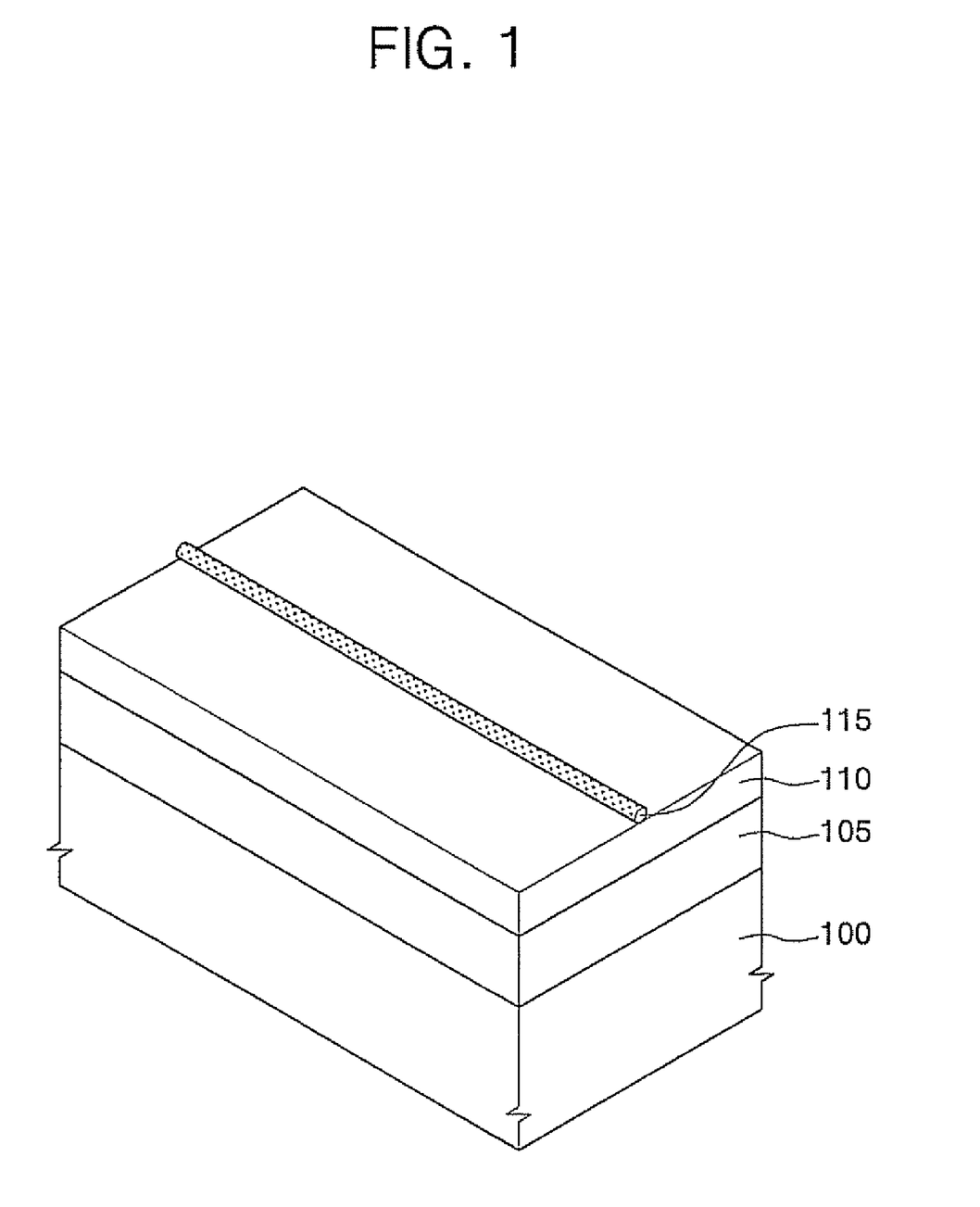
FIGS. 1 through 6 are perspective views illustrating fabrication products and operations for fabricating nano-line semiconductor devices according to some embodiments of the present invention.

Operations for fabricating a semiconductor device according to some embodiments of the present invention will now be explained in reference to FIGS. 1 through 6. Referring to FIG. 1, a substrate 100 is provided. The substrate 100 may be, for example, a semiconductor substrate or a substrate having an insulating layer at its upper surface. A lower layer 105 may be formed on the substrate 100. The lower layer 105 may comprise an insulating layer, such as a silicon oxide layer. A sacrificial material layer 110 is formed on the lower layer 105. The sacrificial material layer 110 may be, for example, an organic material layer and/or a sacrificial insulating layer.

The organic material layer may be, for example, a hexamethyldisilazane (HMDS) layer. The sacrificial insulating layer may be, for example, a silicon oxide layer and/or a silicon nitride layer.

At least one nano-line 115 having semiconductor characteristics is disposed on the sacrificial material layer 110. In some embodiments, the nano-line 115 may be a nano-wire and/or a nano-tube. The nano-line 115 may be, for example, a Si wire, a Ge wire, a GaN wire, a GaP wire, a SiC wire, and/or a ZnO wire. In some embodiments, the nano-line 115 may be a carbon nano-tube and/or an organic nano-tube.

The nano-line may have a core-shell structure, i.e., the core including a nano-wire and the shell including a surface insulating layer. For example, the nano-line 115 may include a Si wire core, and the shell may include a $Si_3N_4$ layer or a $SiO_2$ layer formed on the surface of the Si wire. In other embodiments, the nano-line 115 may include a GaN wire core, and the shell may include a $Ga_2O_3$ layer formed on the surface of the GaN wire.

Formation of the nano-line 115 may include forming nano-lines using semiconductor apparatus, such as an electric furnace or a chemical vapor deposition apparatus, suspending the nano-lines in a solvent, and coating the sacrificial material layer 110 with the solvent bearing the nano-lines using a spin coating method, thereby forming a solvent film having the nano-lines therein. The solvent may be removed by vaporizing or removing solvent during subsequent processes. It will be understood that other techniques may be used to form the nano-line 115.

The nano-line 115 having semiconductor characteristics may have a first conductivity type, e.g., p-type or n-type. Alternatively, the nano-line 115 may be formed such that its center portion has the first conductivity type, and its end portions adjacent to the center portion have a second conductivity type other than the first conductivity type.

Figure 2:
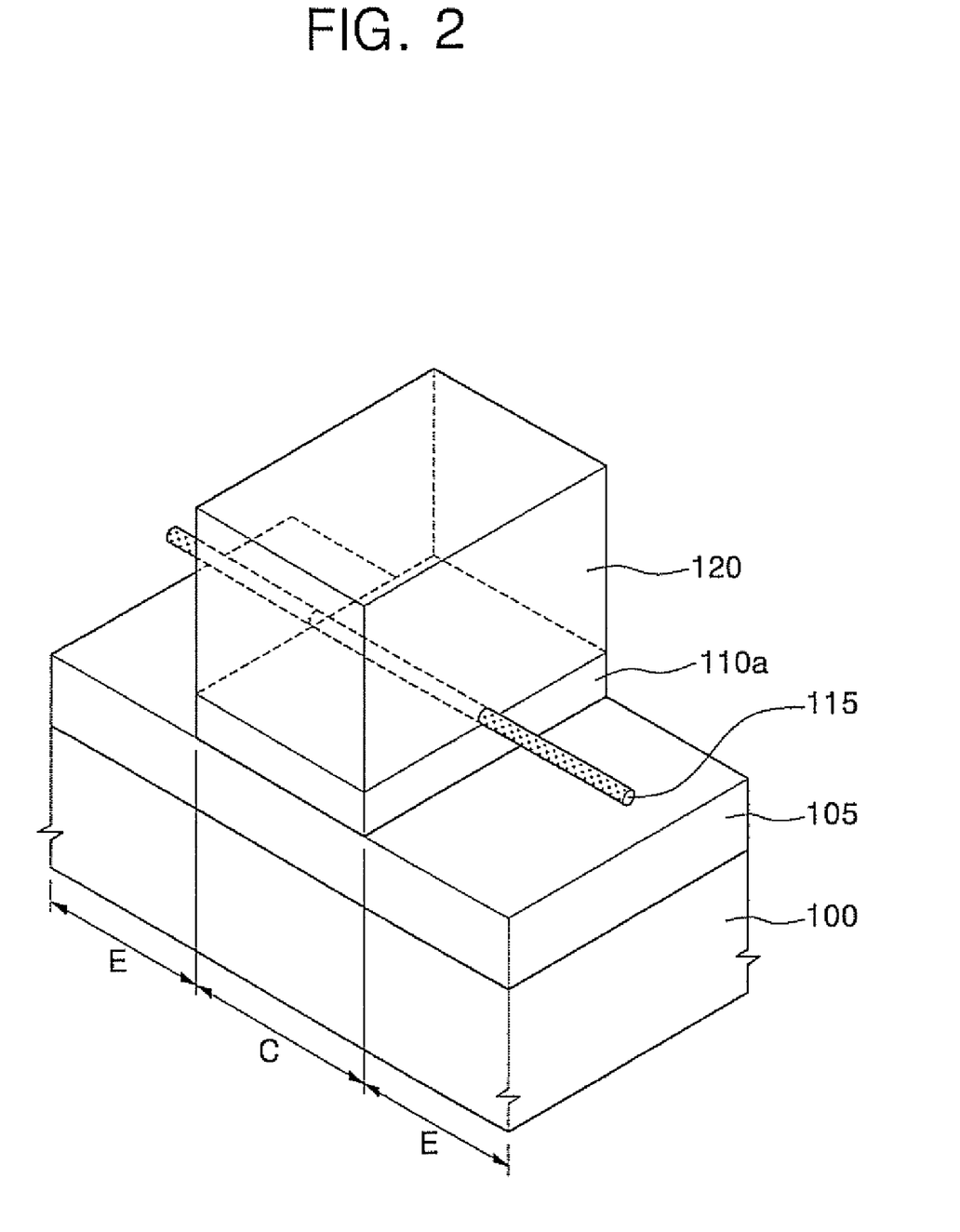

Referring to FIG. 2, a mask pattern 120 is formed on the substrate having the nano-line 115 thereon. The mask pattern 120 may be a photoresist pattern and/or an insulating pattern, for example, a silicon oxide layer and/or a silicon nitride layer. IN FIG. 2, 'C' indicates a center portion of the nano-line 115 covered with the mask pattern 120, and 'E' indicates end portions of the nano-line 115 disposed at respective sides of the mask pattern 120.

The center portion C of the nano-line 115 is covered with the mask pattern 120, while the end portions E of the nano-line 115 are exposed. Specifically, in order to form the mask pattern 120, a mask material layer may be formed on the substrate, covering the nano-line 115, and the mask material layer patterned. The mask material layer may be a photoresist layer and/or a mask insulating layer, such as a silicon oxide layer and/or a silicon nitride layer. When the mask material layer is formed of a photoresist layer, the mask pattern 120 may be a photoresist pattern formed using a photolithography process. When the mask material layer is a mask insulating layer, the mask pattern 120 may be formed using photolithography and etch processes.

If the sacrificial material layer 110 is an organic material layer, such as a hexamethyldisilazane (HMDS) layer, the mask pattern 120 may be a photoresist pattern. The sacrificial material layer 10 disposed at respective sides of the mask pattern 120 may be removed such that the end portions E of the nano-line 115 are exposed and the sacrificial material layer 110 remains below the mask pattern 120 so as to form the sacrificial pattern 110a. If the sacrificial material layer 110 is a sacrificial insulating layer, the mask pattern 120 may be a photoresist pattern or an insulating pattern. In this case, after the mask pattern 120 is formed, the sacrificial material layer 110 may be etched using the mask pattern 120 as an etch mask, thereby exposing the end portions E of the nano-line 115, and forming a sacrificial pattern 110a below the mask pattern 120. If a solvent discussed above with reference to FIG. 1 is still present, portions of the solvent disposed at respective sides of the mask pattern 120 may be removed in the process of forming the sacrificial pattern 110a.

The end portions E of the nano-line 115 disposed at respective sides of the mask pattern 120 may be spaced apart from the upper surface of the lower layer 105 as much as a thickness of the sacrificial material layer 110. When the nano-line 115 is formed as a core-shell structure, the surface insulating layer on the end portions E of the exposed nano-line 115 may be selectively removed. Further, the center portion C of the nano-line 115 may have a first conductivity type, and the end portions E thereof may have a second conductivity type other than the first conductivity type. In other embodiments, the center portion C and the end portions E of the nano-line 115 may have all the first conductivity type. When the center portion C and the end portions E of the nano-line 115 each have the first conductivity type, impurity ions having the second conductivity type other than the first conductivity type may be implanted into the both end portions E of the nano-line 115 using the mask pattern 120 as a mask. For example, impurity ions of the second conductivity type may be implanted into the both end portions E of the nano-line 115 using a plasma doping and/or thermal diffusion doping.

Referring to FIG. 3A, a conductive layer is formed on substrate having the mask pattern 120 thereon, leaving the sidewalls of the upper region of the mask pattern 120 exposed and covering the upper surface of the mask pattern 120 and the substrate at respective sides of the mask pattern 120. The conductive layer portions disposed at both sides of the mask pattern 120 may be defined as a source electrode 125a and a drain electrode 125b, and the conductive layer portion covering the upper surface of the mask pattern 120 may be defined as a sacrificial conductive layer 125c. The conductive layer may be formed using, for example, physical vapor deposition (PVD). The conductive layer may include a metal layer, such as a Ti layer, a Ni layer, a Co layer, a W layer and/or a Pt layer. The source and drain electrodes 125a and 125b may cover the end portions E of the nano-line 115 disposed at respective sides of the mask pattern 120.

Alternatively, as illustrated in FIG. 3B, a conductive layer 225 may be formed on the substrate having the mask pattern 120 such that the mask pattern 120 is completely covered. The conductive layer 225 may be surround the end portions E of the nano-line 115 disposed at respective sides of the mask pattern 120. The conductive layer 225 may be formed using, for example, a chemical vapor deposition method and/or a physical vapor deposition method. For example, the conductive layer 225 may be a metal material layer and/or a polysilicon layer. For example, the conductive layer 225 may include a Ti layer, a Ni layer, a Co layer, a W layer, a Pt layer, a TiSi layer, a NiSi layer, a CoSi layer, a Wsi layer, a PtSi layer, or a doped polysilicon layer.

Referring to FIG. 4, when the source and drain electrodes 125a and 125b and the sacrificial conductive layer 125c are formed as illustrated in FIG. 3A, the mask pattern 120 may be removed using an etch process. The sacrificial conductive layer 125c covering the upper surface of the mask pattern 120 may be removed concurrently with the removal of the mask pattern 120, leaving the source and drain electrodes 125a and 125b. The sacrificial pattern 110a may be subsequently removed to form an opening 126 between the source electrode 125a and the drain electrode 125b. Thus, the center portion C of the nano-line 115 may be exposed and spaced apart from the surface of the lower layer 105 as much as a thickness of the sacrificial pattern 110a.

If the sacrificial pattern 110a is formed of an organic material, such as ENDS, and the mask pattern 120 is formed of a photoresist, the sacrificial pattern 110a and the mask pattern 120 may be removed together. If the sacrificial pattern 110a is an insulating pattern, an etch process may be performed to remove the sacrificial pattern 110a.

If a conductive layer 225 is formed as illustrated in FIG. 3B, the conductive layer 225 may be planarized until the upper surface of the mask pattern 120 is exposed. As a result, source and drain electrodes 125a and 125b may be formed at respective sides of the mask pattern 120. The mask pattern 120 and the sacrificial pattern 110a below the mask pattern 120 may be sequentially removed. The mask pattern 120 may be an insulating pattern. In this manner, an opening 126 may be formed between the source electrode 125a and the drain electrode 125b. If the solvent discussed with reference to FIG. 1 remains, solvent disposed below the mask pattern 120 may be removed in the process of removing the sacrificial pattern 110a. In the resulting structure, the end portions E of the nano-line 115 may be supported by the source and drain electrodes 125a and 125b, and the center portion C of the nano-line 115 is exposed. The center portion C of the nano-line 115 may be spaced from the lower layer 105 as much as a thickness of the sacrificial pattern 110a.

In order to improve resistance characteristics of the source and drain electrodes 125a and 125b and the end portions E of the nano-line 115, a thermal treatment process may be performed. As a result, the respective source and drain electrodes 125a and 125b and the end portions E of the nano-line 115 may react with each other to form metal silicide layers therebetween.

A gate insulating layer 130 is formed on the substrate having the opening 126. The gate insulating layer 130 surrounds at least the center portion C of the nano-line 115 disposed between the source and drain electrodes 125a and 125b. The gate insulating layer 130 may be formed using, for example, atomic layer deposition or chemical vapor deposition. For example, the gate insulating layer 130 may include an $Al_2O_3$ layer, a $TiO_2$ layer, a $HfO_2$ layer, a $ZrO_2$ layer, a $Si_3N_4$ layer, a $Ta_2O_5$ layer, a $SiO_2$ layer, and/or a $Ga_2O_3$ layer. The gate insulating layer 130 may also cover the exposed surfaces of the source and drain electrodes 125a and 125b as well as the center portion C of the nano-line 115. The gate insulating layer 130 may also cover the portion of the lower layer 105 exposed by the opening 126. The portion of the gate insulating layer 130 surrounding the center portion C of the nano-line 115, and the portion of the gate insulating layer 130 formed on the lower layer 105 exposed by the opening 126 may be spaced apart from each other. If the nano-line 115 is formed as a core-shell structure, the gate insulating layer 130 may be omitted, and the surface insulating layer of the center portion of the nano-line 115 may function as a gate insulating layer.

Referring to FIG. 5, a gate electrode 140 is formed surrounding the center portion C of the nano-line 115. If the center portion C of the nano-line 115 is surrounded by a gate insulating layer portion 130a, the gate electrode 140 may be formed to surround the gate insulating layer portion 130a surrounding the center portion C of the nano-line 115. The portion of the nano-line 115 surrounded by the gate electrode 140 may serve as a channel region.

Formation of the gate electrode 140 may include forming a conductive material layer on the substrate having the gate insulating layer 130 (see FIG. 4), and planarizing the conductive material layer until the portions of the gate insulating layer 130 covering the upper surfaces of the source and drain electrodes 125a and 125b are exposed. Photolithography and etch processes may be performed to define a gate contact region of the planarized conductive material layer. The gate electrode 140 may include, for example, a metal silicide layer and/or a silicon layer. Alternatively, the gate electrode 140 may be formed employing patterning technology using photolithography and etch processes, or may be formed employing lift-off technology using a gate mask pattern having a gate opening exposing a region where the gate electrode 140 will be formed.

Referring to FIG. 6, a gate electrode 240 surrounding a portion of the center portion C of the nano-line 115 may be formed on the substrate having a gate insulating layer 130 (see FIG. 4). The portion of the nano-line 115 surrounded by the gate electrode 240 serves as a channel region. Formation of the gate electrode 240 may include forming a conductive material layer on the substrate having the gate insulating layer 130 using physical vapor deposition and/or chemical vapor deposition, and patterning the conductive material layer using photolithography and etch processes. As a result, the gate electrode 240 may be formed to surround the gate insulating layer 130 surrounding the channel region of the nano-line 115. The width of the gate electrode 240 may be determined by the process of patterning the conductive material layer using the photolithography and etch processes. The gate electrode 240 may be spaced apart from the source and drain electrodes 125a and 125b a predetermined distance as illustrated in FIG. 6.

Alternatively, formation of the gate electrode 240 employing lift-off technology may include forming a gate mask pattern having a gate opening exposing a predetermined portion of the center portion C of the nano-line 115 on the substrate having the gate insulating layer 130, forming a conductive material layer exposing sidewalls of the upper region of the gate mask pattern on the substrate having the gate mask pattern, and removing the conductive material layer on the gate mask pattern and removing the gate mask pattern. In this case, the gate mask pattern may include a photoresist pattern, and the conductive material layer may be formed using physical vapor deposition. As a result, the gate electrode 240 may be formed between the source and drain electrodes 125a and 125b. The gate insulating layer 130 and the gate electrodes 140 and 240 may be formed to surround the channel region of the nano-line 115.

As described above, the channel region of the nano-line 115 may be surrounded by a gate insulating layer portion 130a, and the gate electrodes 140 and 240. Thus, a transistor having a cylindrical gate may be formed. The cylindrical gate may suppress a surface scattering of the electrons moving through the channel remarkably as compared to the gate of a planar transistor. As a result, an operating speed of a semiconductor device may be improved.

Further, the source and drain electrodes 125a and 125b may contact and surround the nano-line 115. As a result, because a contact area between the source and drain electrodes 125a and 125b and the nano-line 115 can be increased, source/drain contact resistance characteristics can be improved.

If the nano-line 115 is formed with the first conductivity type, the source and drain electrodes 125a and 125b and the nano-line 115 may form a Schottky barrier. As a result, a Schottky barrier tunnel transistor using the nano-line 115 may be formed.

Therefore, the transistor may have a cylindrical gate and use the nano-line 115 as a channel. As a result, an operating speed and performance of the semiconductor device can be improved. Further, since the transistor can be scaled down, a highly-integrated semiconductor device can be fabricated.

As described above, according to some embodiments of the present invention, a transistor having a cylindrical gate and using a nano-line as a channel is provided. The transistor may be scaled down to a very small size. Furthermore, since source and drain electrodes may be formed to surround the nano-line, a contact area between the source and drain electrodes and the nano-line can be increased. As a result, source/drain contact resistance characteristics of the transistor can be improved. Therefore, a performance of a semiconductor device composed of the transistors as above can be improved. Further, a highly integrated semiconductor device can be fabricated.

It will be apparent to those skilled in the art that various modifications and variations can be made in the present invention. Thus, it is intended that the present invention covers the modifications and variations of this invention provided they come within the scope of the appended claims and their equivalents.

What is claimed is:

1. A method of fabricating a semiconductor device comprising:
    forming a sacrificial material layer on a substrate;
    disposing at least one nano-line having semiconductor characteristics on the sacrificial material layer;
    forming a mask pattern on a portion of the nano-line and the sacrificial material layer;
    forming spaced apart source and drain electrodes at respective sides of the mask pattern and surrounding respective portions of the nano-line at the respective sides of the mask pattern;
    removing the mask pattern and at least a portion of the sacrificial material layer below the mask pattern and the at least one nano-line to form an opening exposing a portion of the nano-line between the source and drain electrodes; and
    forming a gate electrode surrounding the exposed portion of the nano-line.

2. The method of claim 1, wherein the sacrificial material layer comprises an organic material layer and/or an insulating layer.

3. The method of claim 2, wherein the organic material layer comprises hexamethyldisilazane (HMDS).

4. The method of claim 1, wherein the nano-line comprises a nano-wire and/or a nano-tube.

5. The method of claim 4, wherein the nano-line comprises a Si nano-wire, a Ge nano-wire, a GaN nano-wire, a GaP nano-wire, a SiC nano-wire, a ZnO nano-wire, a carbon nano-tube and/or an organic nano-tube.

6. The method of claim 1, wherein the nano-line has a core-shell structure comprising a nano-wire surrounded by a surface insulating layer.

7. The method of claim 1, wherein forming the gate electrode comprises:
    forming a conductive material layer on the substrate having the opening exposing the portion of the nano-line between the source and drain electrodes; and
    patterning the conductive material layer using photolithography and etch processes.

8. The method of claim 1, wherein forming the gate electrode comprises:
    forming a gate mask pattern having a gate opening exposing a portion of the nano-line between the source and drain electrodes;

forming a conductive material layer on the gate mask pattern and adjacent portions of the substrate and leaving portions of sidewalls of the gate mask pattern exposed; and removing the gate mask pattern and the conductive material layer on the gate mask pattern.

9. The method of claim 6, further comprising removing portions of the surface insulating layer of the nano-line at the respective sides of the mask pattern after forming the mask pattern.

10. The method of claim 1, further comprising forming a gate insulating layer on the substrate before forming the gate electrode, wherein the gate insulating layer surrounds at least a portion of the nano-line disposed between the source and drain electrodes.

11. The method of claim 10, wherein the gate insulating layer is formed using atomic layer deposition and/or chemical vapor deposition.

12. The method of claim 11, wherein forming the gate electrode comprises:

forming a conductive material layer on the substrate having the gate insulating layer thereon; and planarizing the conductive material layer to expose portions of the gate insulating layer covering upper surfaces of the source and drain electrodes.

13. A method of fabricating a semiconductor device comprising:

forming a sacrificial material layer on a substrate;

disposing at least one nano-line having semiconductor characteristics on the sacrificial material layer;

forming a mask pattern on a portion of the nano-line and the sacrificial material layer;

removing portions of the sacrificial material layer disposed at respective sides of the mask pattern after forming the mask pattern such that portions of the nano-line are exposed at the respective sides of the mask pattern and spaced apart from the substrate;

forming spaced apart source and drain electrodes at the respective sides of the mask pattern and surrounding respective portions of the nano-line at the respective sides of the mask pattern;

removing the mask pattern and at least a portion of the sacrificial material layer below the mask pattern to form an opening exposing a portion of the nano-line between the source and drain electrodes; and forming a gate electrode surrounding the exposed portion of the nano-line.

14. The method of claim 13, wherein forming the source and drain electrodes comprises:

forming a conductive layer on the substrate from which the portions of the sacrificial material layer disposed at the respective sides of the mask pattern are removed; and planarizing the conductive layer to expose the mask pattern.

15. The method of claim 13, wherein forming the source and drain electrodes comprises forming a conductive layer on the substrate from which the portions of the sacrificial material layer disposed at the respective sides of the mask pattern are removed such that sidewalls of an upper region of the mask pattern are exposed, and wherein a portion of the conductive layer disposed on the mask pattern is removed when the mask pattern is removed.

16. The method of claim 13, wherein the conductive layer is formed using physical vapor deposition.

* * * * *

UNITED STATES PATENT AND TRADEMARK OFFICE
CERTIFICATE OF CORRECTION

PATENT NO. : 7,482,206 B2  
APPLICATION NO. : 11/422663  
DATED : January 27, 2009  
INVENTOR(S) : Baik et al.

Page 1 of 1

It is certified that error appears in the above-identified patent and that said Letters Patent is hereby corrected as shown below:

Column 8, Line 4: Please correct "ENDS" to read -- HMDS --

Column 12, Claim 16, Line 31: Please correct "The method of claim 13" to read -- The method of claim 15 --

Signed and Sealed this

Fourteenth Day of July, 2009

JOHN DOLL  
*Acting Director of the United States Patent and Trademark Office*

UNITED STATES PATENT AND TRADEMARK OFFICE
CERTIFICATE OF CORRECTION

PATENT NO. : 7,482,206 B2  Page 1 of 1
APPLICATION NO. : 11/422663
DATED : January 27, 2009
INVENTOR(S) : Baik et al.

It is certified that error appears in the above-identified patent and that said Letters Patent is hereby corrected as shown below:

On the Title Page:
Item 73, Assignee: Please correct "Samsung Electronics Co., Ltd. (KR)"
to read -- Samsung Electronics Co., Ltd. (KR) and Korea Chungang Educational Foundation (KR) --

Signed and Sealed this

Thirteenth Day of October, 2009

David J. Kappos
*Director of the United States Patent and Trademark Office*